United States Patent
Hirosaki

(10) Patent No.: US 7,431,864 B2
(45) Date of Patent: Oct. 7, 2008

(54) PHOSPHOR, PRODUCTION METHOD THEREOF AND LIGHT EMITTING INSTRUMENT

(75) Inventor: Naoto Hirosaki, Tsukuba (JP)

(73) Assignee: National Institute for Materials Science, Tsukuba-shi, Ibaraki (JP)

(*) Notice: Subject to any disclaimer, the term of this patent is extended or adjusted under 35 U.S.C. 154(b) by 0 days.

(21) Appl. No.: 11/704,210

(22) Filed: Feb. 9, 2007

(65) Prior Publication Data

US 2007/0194685 A1    Aug. 23, 2007

Related U.S. Application Data

(63) Continuation of application No. PCT/JP2005/014973, filed on Aug. 10, 2005.

(30) Foreign Application Priority Data

Aug. 11, 2004   (JP)   ............... 2004-234690

(51) Int. Cl.
    *H01J 1/63*     (2006.01)
    *H01J 11/02*    (2006.01)
    *H01J 29/20*    (2006.01)

(52) U.S. Cl. .............. 252/301.4 R; 313/463; 313/467; 313/486; 313/503; 313/582; 313/584; 252/301.4 F; 252/301.6 R; 252/301.6 F; 252/301.5

(58) Field of Classification Search .......... 252/301.4 R, 252/301.4 F, 301.5, 301.6 R, 301.6 F; 313/463, 313/467, 486, 503, 582, 584
See application file for complete search history.

(56) References Cited

U.S. PATENT DOCUMENTS 7,138,756 B2 * 11/2006 Gotoh et al. ............. 313/467

FOREIGN PATENT DOCUMENTS

| EP | 155047 | * 9/1985 |
|---|---|---|
| JP | S62-167260 | 7/1987 |
| JP | H05-263075 | 10/1993 |
| JP | H11-116946 | 4/1999 |
| JP | 2004-277547 | 10/2004 |

* cited by examiner

*Primary Examiner*—C. Melissa Koslow
(74) *Attorney, Agent, or Firm*—Manabu Kanesaka

(57) ABSTRACT

The present invention aims at providing a blue-aimed phosphor powder which is more excellent in emission characteristic than the conventional rare-earth activated sialon phosphors and which is more excellent in durability than the conventional oxide phosphors.

The solving means resides in:
  firing a starting material mixture in a nitrogen atmosphere at a temperature range between 1,500° C. inclusive and 2,200° C. inclusive,
  wherein the starting material mixture is a mixture of metallic compounds, and is capable of constituting a composition comprising M, A, Si, Al, O, and N (M is one kind or two or more kinds of element(s) selected from Mn, Ce, Nd, Sm, Eu, Tb, Dy, Ho, Er, Tm, and Yb; and A is one kind or two or more kinds of element(s) selected from C, Si, Ge, Sn, B, Ga, In, Mg, Ca, Sr, Ba, Sc, Y, La, Gd, Lu, Ti, Zr, Hf, Ta, and W) by firing;
  to obtain a phosphor which emits fluorescence having a peak at a wavelength within a range of 400 nm to 700 nm, by irradiation of an excitation source.

12 Claims, 4 Drawing Sheets

PHOSPHOR, PRODUCTION METHOD THEREOF AND LIGHT EMITTING INSTRUMENT

CROSS REFERENCE TO RELATED APPLICATION

This is a continuation application of PCT/JP2005/014973 filed on Aug. 10, 2005.

TECHNICAL FIELD

The present invention relates to a phosphor including, as a host crystal, an AlN crystal or AlN solid-solution crystal, and a production method and usage thereof. More particularly, the usage relates to a light emitting instrument for a lighting instrument and for an image displaying apparatus, utilizing the nature possessed by the phosphor, i.e., the property to emit light having a peak at a wavelength between 400 nm inclusive and 700 nm inclusive, particularly between 450 nm inclusive and 520 nm inclusive.

BACKGROUND ART

Phosphors have been utilized for vacuum fluorescent displays (VFD), field emission displays (FED), plasma display panels (PDP), cathode ray tubes (CRT), white light emitting diodes (LED), and the like. In all these usages, it is required to supply an energy to an applicable phosphor to thereby excite it so as to cause it to emit light, and the phosphor is excited by an excitation source having a higher energy such as vacuum ultraviolet light, ultraviolet light, electron beam, blue light, or the like, such that the phosphor is caused to emit visible light.

However, since phosphors are exposed to the aforementioned excitation sources to resultingly cause a problem of deteriorated luminance, thereby necessitating a phosphor which is free of luminance deterioration. As such, there have been proposed a sialon phosphor, an oxynitride phosphor, and a nitride phosphor as phosphors each exhibiting less luminance deterioration, instead of the conventional silicate phosphor, phosphate phosphor, aluminate phosphor, sulfide phosphor, and the like.

One example of the sialon phosphor is produced by a production process as generally described below. Firstly, there are mutually mixed silicon nitride ($Si_3N_4$), aluminum nitride (AlN), and europium oxide ($Eu_2O_3$) at a predetermined molar ratio, followed by holding for 1 hour at a temperature of 1,700° C. in nitrogen at 1 atm (0.1 MPa), and firing by hot pressing for production (see patent-related reference 1, for example). It has been reported that α-sialon obtained by the process and activated by Eu ion is established into a phosphor which is excited by blue light at 450 to 500 nm and caused to emit yellow light at 550 to 600 nm. There has been further known a phosphor provided by adding a rare earth element to β-sialon (see patent-related reference 2), and it is shown therein that phosphors activated with Tb, Yb, and Ag are established into ones each emitting green light from 525 nm to 545 nm. Moreover, there has been known a green-aimed phosphor provided by activating β-sialon with $Eu^{2+}$ (see patent-related reference 3).

Examples of oxinitride phosphors include ones each having a JEM phase or $La_3Si_8N_{11}O_4$ phase as a host material. Namely, there have been known a blue-aimed phosphor including, as a host crystal, a JEM phase ($LaAl(Si_{6-z}Al_z)N_{10-z}O_z$) activated with Ce (see patent-related reference 4), and a blue-aimed phosphor including, as a host crystal, $La_3Si_8N_{11}O_4$ activated with Ce (see patent-related reference 5).

Known as one example of nitride phosphors is a red-aimed phosphor including, as a host crystal, $CaAlSiN_3$ activated with Eu (see patent-related reference 6). Further, it is reported in a patent-unrelated reference 1 that there has been obtained an orange-aimed phosphor or red-aimed phosphor having an emission peak between 580 nm and 640 nm as a phosphor including AlN as a host crystal, by synthesizing an amorphous ceramic thin-film of $AlN:Eu^{3+}$ by a magnetron sputtering method at a room temperature. It is further reported in a patent-unrelated reference 2 that a phosphor obtained by activating an amorphous AlN thin-film with $Tb^{3+}$ emits green light having a peak at 543 nm by electron beam excitation. Moreover, there has been reported a phosphor including an AlN thin-film activated with $Gd^{3+}$ in a patent-unrelated reference 3. However, all the phosphors based on AlN are amorphous thin-films, and are thus unsuitable for usage in a white LED, display, and the like.

Referenced Literature/Publication:
Patent-related reference 1: JP-A-2002-363554
Patent-related reference 2: JP-A-60-206889
Patent-related reference 3: Publication matured from Japanese Patent Application No. 2004-070894
Patent-related reference 4: Publication matured from Japanese Patent Application No. 2003-208409
Patent-related reference 5: Publication matured from Japanese Patent Application No. 2003-346013
Patent-related reference 6: Publication matured from Japanese Patent Application No. 2004-41503
Patent-unrelated reference 1: Meghan L. Caldwell, et al, MRS Internet Journal Nitride Semiconductor Research, vol. 6, No. 13, p. 1-8 (2001)
Patent-unrelated reference 2: H. H. Richardson, et al, Applied Physics Letters, vol. 80, No. 12, p. 2207-2209 (2002)
Patent-unrelated reference 3: U. Vetter, et al, Physics Letters, vol. 83, No. 11, p. 2145-2147 (2003)

However, there have been demanded phosphors aimed at various colors and having higher luminances with excellent durability, for usage in white LED, plasma display, and the like each having an ultraviolet LED as an excitation source. Although the phosphors including a JEM phase and $La_3Si_8N_{11}O_4$ as host materials, respectively, have been reported as nitride phosphors or oxynitride phosphors emitting blue light, luminance thereof is not regarded as being sufficient, thereby demanding a phosphor for exhibiting a higher luminance.

DISCLOSURE OF THE INVENTION

Problem to be Solved by the Invention

The present invention intends to satisfy such a demand, and has an object to provide a phosphor powder which is more excellent in emission characteristic than the conventional rare-earth activated sialon phosphors and which is more excellent in durability than the conventional oxide phosphors. Particularly, the present invention aims at providing blue-aimed and red-aimed phosphor powders.

Means for Solving the Problem

Under these circumstances, the present inventors have earnestly and repeatedly investigated oxynitrides each including an AlN crystal or AlN solid-solution crystal including at least, dissolved therein in a solid state, a metallic element M (M is one kind or two or more kinds of element(s) selected from Mn, Ce, Nd, Sm, Eu, Tb, Dy, Ho, Er, Tm, and Yb) and oxygen, and have found that those oxynitrides having particular composition ranges, particular solid solution states, and particular crystal phases have higher luminances, and those oxynitrides having particular composition ranges are established into blue-aimed phosphors having emission peaks at wavelengths within a range between 450 nm inclusive and 520 nm inclusive, respectively. The present inventors also have found that those oxynitrides having other particular composition ranges are established into red-aimed phosphors having emission peaks at wavelengths within a range between 580 nm inclusive and 650 nm inclusive.

Although the patent-unrelated references 1 to 3 have reported that the thin-films obtained by activating AlN amorphous thin-films with $Eu^{3+}$, $Tb^{3+}$, and $Gd^{3+}$, respectively, exhibit emission by electron beam excitation, it has been never considered to use inorganic compounds each including, as host materials, AlN crystal or AlN solid-solution crystal including oxygen, as phosphors, respectively. Namely, the present inventors have found for the first time such an important discovery that AlN crystals or AlN solid-solution crystals including, dissolved therein in a solid state, a particular metallic element and oxygen, can be used as phosphors exhibiting emission at higher luminances by excitation of ultraviolet light, visible light, electron beam, or X-rays. The present inventors have earnestly and repetitively conducted investigation based on the above knowledge, and have succeeded in providing: phosphors which exhibit emission phenomena at higher luminances over specific wavelength ranges, respectively; a production method of the phosphor; and a lighting instrument and an image displaying apparatus based thereon, having excellent characteristics; by achieving configurations recited in the following items (1) through (47). The above configurations are recited in the following items (1) through (47).

(1) A phosphor, characterized in that the phosphor comprise an AlN crystal or AlN solid-solution crystal including, at least: a metallic element M (M is one kind or two or more kinds of element(s) selected from Mn, Ce, Nd, Sm, Eu, Tb, Dy, Ho, Er, Tm, and Yb) and oxygen, both dissolved in the crystal in a solid state; and that the phosphor emits fluorescence having a peak at a wavelength within a range of 400 nm to 700 nm, by irradiation of an excitation source.

(2) The phosphor of item (1), characterized in that the AlN crystal or AlN solid-solution crystal has a wurtzite-type AlN crystal structure.

(3) The phosphor of item (1) or (2), characterized in that the AlN solid-solution crystal has a crystal structure selected from 2Hδ, 27R, 21R, 12H, 15R, and 8H.

(4) The phosphor of any one of items (1) through (3), characterized in that the phosphor includes, at least: the metallic element M of item 1; Al; O; N; and an element A (A is one kind or two or more kinds of element(s) selected from C, Si, Ge, Sn, B, Ga, In, Mg, Ca, Sr, Ba, Sc, Y, La, Gd, Lu, Ti, Zr, Hf, Ta, and W).

(5) The phosphor of any one of items (1) through (4), characterized in that the phosphor includes: the metallic element M of item (1); the element A of item (4); and elements of Al, O, and N; and that the phosphor is represented by a composition formula $M_aAl_bA_cN_dO_e$ (where $a+b+c+d+e=1$) satisfying the following conditions:

$0.00001 \leq a \leq 0.1$ (i), $0.4 \leq b \leq 0.55$ (ii), $0.001 \leq c \leq 0.1$ (iii), $0.4 \leq d \leq 0.55$ (iv), and $0.001 \leq e \leq 0.1$ (v).

(6) The phosphor of item (4) or (5), characterized in that the phosphor includes at least Si, as the element A.

(7) The phosphor of any one of items (1) through (6), characterized in that the phosphor includes at least Eu, as the metallic element M.

(8) The phosphor of any one of items (1) through (7), characterized in that the phosphor is represented by a composition formula $Eu_aAl_bSi_cN_dO_e$ (where $a+b+c+d+e=1$) satisfying the following conditions:

$0.00001 \leq a \leq 0.1$ (i), $0.4 \leq b \leq 0.55$ (ii), $0.001 \leq c \leq 0.1$ (iii), $0.4 \leq d \leq 0.55$ (iv), and $0.001 \leq e \leq 0.1$ (v);

that Eu is divalent; and that the phosphor has an emission peak wavelength within a range between 450 nm inclusive and 520 nm inclusive.

(9) The phosphor of any one of items (1) through (6), characterized in that the phosphor includes at least Mn, as the metallic element M.

(10) The phosphor of any one of items (1) through (6), characterized in that the phosphor is represented by a composition formula $Mn_aAl_bSi_cN_dO_e$ (where $a+b+c+d+e=1$) satisfying the following conditions:

$0.00001 \leq a \leq 0.1$ (i), $0.4 \leq b \leq 0.55$ (ii), $0.001 \leq c \leq 0.1$ (iii), $0.4 \leq d \leq 0.55$ (iv), and $0.001 \leq e \leq 0.1$ (v);

and that the phosphor has an emission peak wavelength within a range between 560 nm inclusive and 650 nm inclusive.

(11) The phosphor of item (9) or (10), characterized in that the phosphor has an afterglow time of 5 seconds or longer, over which an emission intensity of 1/10 or stronger is kept even after termination of irradiation of the excitation source.

(12) The phosphor of any one of items (1) through (11), characterized in that the AlN crystal or AlN solid-solution crystal comprises single crystal particles or aggregations of single crystals having an averaged particle size between 0.1 μm inclusive and 20 μm inclusive.

(13) The phosphor of any one of items (1) through (12), characterized in that the excitation source is ultraviolet light or visible light having a wavelength between 100 nm inclusive and 500 nm inclusive.

(14) The phosphor of any one of items (1) through (12), characterized in that the excitation source is electron beam or X-rays.

(15) A phosphor characterized in that the phosphor comprises a mixture of: the inorganic compound constituting the phosphor of any one of items (1) through (14); and an additional crystal phase or amorphous phase; and that the inorganic compound constituting the phosphor of any one of items (1) through (14) is included at a content of 10 mass % or more.

(16) The phosphor of item (15), characterized in that the inorganic compound constituting the phosphor of any one of items (1) through (14) is included at a content of 50 mass % or more.

(17) The phosphor of item (15) or (16), characterized in that the additional crystal phase or amorphous phase is an inorganic substance having electroconductivity.

(18) The phosphor of item (17), characterized in that the inorganic substance having electroconductivity is oxide, oxynitride, nitride, or a mixture thereof including one kind or two or more kinds of element(s) selected from Zn, Ga, In, and Sn.

(19) A production method of the phosphor of any one of items (1) through (18), characterized in that the method comprises the step of:

firing a starting material mixture in a nitrogen atmosphere at a temperature range between 1,500° C. inclusive and 2,200° C. inclusive, wherein the starting material mixture is a mixture of metallic compounds, and is capable of constituting a composition comprising M, A, Si, Al, O, and N (M is one kind or two or more kinds of element(s) selected from Mn, Ce, Nd, Sm, Eu, Tb, Dy, Ho, Er, Tm, and Yb; and A is one kind or two or more kinds of element(s) selected from C, Si, Ge, Sn, B, Ga, In, Mg, Ca, Sr, Ba, Sc, Y, La, Gd, Lu, Ti, Zr, Hf, Ta, and W) by firing.

(20) The production method of the phosphor of item (19), characterized in that the metallic compound mixture is a mixture of: a metal, oxide, carbonate, nitride, fluoride, chloride, or oxynitride of M; silicon nitride; and aluminum nitride.

(21) The production method of the phosphor of item (19) or (20), characterized in that M is Eu.

(22) The production method of the phosphor of item (19) or (20), characterized in that M is Mn.

(23) The production method of the phosphor of any one of items (19) through (22), characterized in that A is Si.

(24) The production method of the phosphor of any one of items (19) through (23), characterized in that the nitrogen atmosphere is a gas atmosphere at a pressure in a range between 0.1 MPa inclusive and 100 MPa inclusive.

(25) The production method of the phosphor of any one of items (19) through (24), characterized in that the method further comprises the step of:

firing the metallic compounds each in a form of powder or aggregations, after filling the metallic compounds in a container in a state where the metallic compounds are held at a filling ratio exhibiting a relative bulk density of 40% or less.

(26) The production method of the phosphor of item (25), characterized in that the container is made of boron nitride.

(27) The production method of the phosphor of item (25) or (26), characterized in that aggregations have an averaged aggregation size of 500 µm or less.

(28) The production method of the phosphor of any one of items (19) through (27), characterized in that the firing step is conducted not by means of hot-press, but exclusively by means of gas pressure sintering.

(29) The production method of the phosphor of any one of items (19) through (28), characterized in that the method further comprises the step of:

adjusting the synthesized phosphor powder in granularity, to cause the same to have an averaged particle size between 50 nm inclusive and 20 µm inclusive, by a single or multiple procedures selected from pulverization, classification, and acid treatment.

(30) The production method of the phosphor of any one of items (19) through (29), characterized in that the method further comprises the step of:

heat treating the phosphor powder after firing, the phosphor powder after pulverization treatment, or the phosphor powder after granularity adjustment, at a temperature between 1,000° C. inclusive and the firing temperature inclusive.

(31) The production method of the phosphor of any one of items (19) through (30), characterized in that the method further comprises the step of:

before the firing step, adding an inorganic compound for generating a liquid phase at the firing temperature or below, into the mixture of metallic compounds.

(32) The production method of the phosphor of item (31), characterized in that the inorganic compound for generating the liquid phase at the firing temperature or below, is one kind or a combination of two or more kinds of fluoride, chloride, iodide, bromide, and phosphate of one kind or two or more kinds of element(s) selected from Li, Na, K, Mg, Ca, Sr, Ba, and Al.

(33) The production method of the phosphor of item (31) or (32), characterized in that the inorganic compound for generating the liquid phase at the firing temperature or below, is calcium fluoride or aluminum fluoride.

(34) The production method of the phosphor of any one of items (31) through (33), characterized in that the inorganic compound for generating the liquid phase at the firing temperature or below, is added at an amount between 0.1 parts by weight inclusive and 10 parts by weight inclusive, relative to 100 parts by weight of the mixture of metallic compounds.

(35) The production method of the phosphor of any one of items (19) through (34), characterized in that the method further comprises the step of:

washing the product after firing by a solvent comprising water or an acidic water solution, to thereby decrease contents of a glass phase, second phase, or impurity phase included in the product.

(36) The production method of the phosphor of item (35), characterized in that the acid comprises a single or a combination of sulfuric acid, hydrochloric acid, nitric acid, hydrofluoric acid, and organic acids.

(37) The production method of the phosphor of item (35) or (36), characterized in that the acid is a mixture of hydrofluoric acid and sulfuric acid.

(38) A lighting instrument constituted of a light-emitting source and a phosphor, characterized in that the phosphor of at least one of items (1) through (18) is used.

(39) The lighting instrument of item (38), characterized in that the light-emitting source is a light emitting diode (LED) or laser diode (LD) for emitting light at a wavelength of 330 to 500 nm.

(40) The lighting instrument of item (38) or (39), characterized in that the light-emitting source is an LED or LD for emitting light at a wavelength between 330 and 420 nm; and that the constituent phosphor is provided by adopting: the phosphor of any one of items (1) through (18); a green-aimed phosphor having an emission peak at a wavelength between 520 nm and 550 nm by pump light between 330 and 420 nm; and a red-aimed phosphor having an emission peak at a wavelength between 600 nm and 700 nm by pump light between 330 and 420 nm; so that the constituent phosphor emits white light mixedly including blue light, green light, and red light.

(41) The lighting instrument of item (38) or (39), characterized in that the light-emitting source is an LED or LD for emitting light at a wavelength between 330 and 420 nm; and that the constituent phosphor is provided by adopting: the phosphor of any one of items (1) through (18); a green-aimed phosphor having an emission peak at a wavelength between 520 nm and 550 nm by pump light between 330 and 420 nm; a yellow-aimed phosphor having an emission peak at a wavelength between 550 nm and 600 nm by pump light between 330 and 420 nm; and a red-aimed phosphor having an emission peak at a wavelength between 600 nm and 700 nm by pump light between 330 and 420 nm; so that the constituent phosphor emits white light mixedly including blue light, green light, yellow light, and red light.

(42) The lighting instrument of item (40) or (41), characterized in that the green-aimed phosphor is β-sialon activated with Eu.

(43) The lighting instrument of item (40) or (41), the red-aimed phosphor is $CaAlSiN_3$ activated with Eu.

(44) The lighting instrument of item (41), characterized in that the yellow-aimed phosphor is Ca-α-sialon activated with Eu.

(45) An image displaying apparatus constituted of an excitation source and a phosphor, characterized in that the phosphor of at least one of items (1) through (18) is used.

(46) The image displaying apparatus of item (45), characterized in that the excitation source is electron beam, electric field, vacuum ultraviolet light, or ultraviolet light.

(47) The image displaying apparatus of item (45) or (46), characterized in that the image displaying apparatus is a vacuum fluorescent display (VFD), field emission display (FED), plasma display panel (PDP), or cathode ray tube (CRT).

Effect of the Invention

The phosphors of the present invention each contain, as a main component, an AlN crystal or AlN solid-solution crystal phase to thereby exhibit a higher emission intensity within a wavelength range of 400 nm to 700 nm as compared with the conventional sialon phosphors and oxynitride phosphors, and among them, the phosphors of the present invention activated with Eu are excellent as blue-aimed or green-aimed phosphors, and the phosphors of the present invention activated with Mn are excellent as red-aimed phosphors. Further, the phosphors of the present invention serve as useful ones exhibiting such remarkable functions and effects that the phosphors are stably functionable as and usable as VFD, FED, PDP, CRT, white LED, and the like without luminance deterioration even when exposed to excitation sources.

EXPLANATION OF REFERENCE NUMERALS

Figure 1:
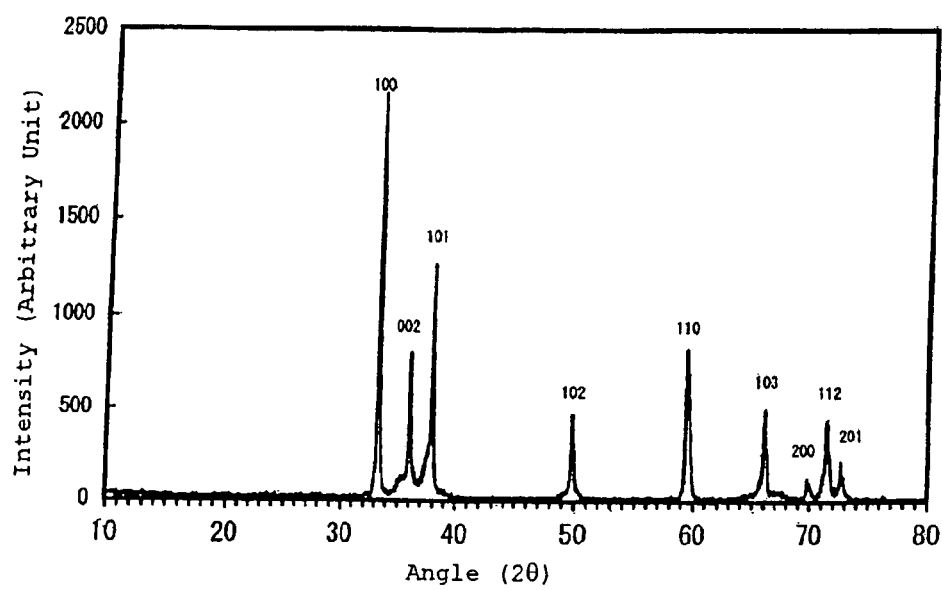
FIG. 1 is an X-ray diffraction chart of an inorganic compound of Example 1.

| | |
|---|---|
| 1 | mixture of green-aimed phosphor (Example 1) of the present invention, red-aimed phosphor, and blue-aimed phosphor; mixture of green-aimed phosphor (Example 1) of the present invention and red-aimed phosphor; or mixture of green-aimed phosphor (Example 1) of the present invention and yellow-aimed phosphor |
| 2 | LED chip |
| 3, 4 | electroconductive terminal |
| 5 | wire bond |
| 6 | resin layer |
| 7 | vessel |
| 8 | red-aimed phosphor |
| 9 | green-aimed phosphor |
| 10 | blue-aimed phosphor |
| 11, 12, 13 | ultraviolet emission cell |
| 14, 15, 16, 17 | Electrode |
| 18, 19 | dielectric layer |
| 20 | protection layer |
| 21, 22 | glass substrate |

BEST MODE FOR CARRYING OUT THE INVENTION

The present invention will be described in detail, based on Examples.

The phosphors of the present invention each include an AlN crystal or AlN solid-solution crystal as a main component. The AlN crystal is one having a wurtzite-type crystal structure. Further, the AlN solid-solution crystal includes AlN having silicon, oxygen, and the like added thereto, and is one such as:

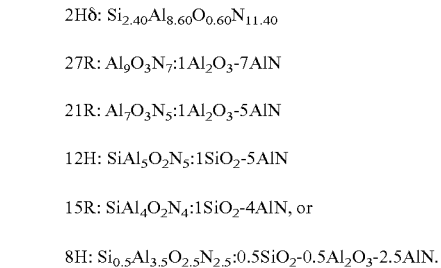

In the present invention, these crystals can each be used as a host crystal. The AlN crystal or AlN solid-solution crystal can be identified by X-ray diffraction, neutron beam diffraction, and the like; and, in addition to those substances exhibiting the same diffraction as the pure AlN crystal and AlN solid-solution crystal, those AlN crystals and AlN solid-solution crystals are also embraced within the present invention which have lattice constants changed by substitution of constituent elements by other elements.

According to the present invention, dissolving, in a solid state, a metallic element M and oxygen in an AlN crystal or AlN solid-solution crystal as a host crystal, provides a phosphor having excellent optical characteristics. Here, the metallic element M is one to be matured into a photoactive ion, and is one kind or two or more kinds of element(s) selected from Mn, Ce, Nd, Sm, Eu, Tb, Dy, Ho, Er, Tm, and Yb, in a manner that these elements are excited by ultraviolet light, electron beam, or the like to exhibit emission to thereby establish a phosphor emitting fluorescence having a peak at a wavelength within a range of 400 nm to 700 nm. Among them, phosphors including Eu serve as particularly excellent ones emitting blue to green light at higher luminance. Further, phosphors including Mn serve as red-aimed ones with higher luminance. The effect of oxygen is considered to cause the M to be readily dissolved in the host crystal in a solid state by virtue of combination of the M with oxygen, thereby resultingly contributing to improving luminance of the applicable phosphor.

Embraced as one of embodiments of the present invention is a phosphor including, at least, a metallic element M, Al, O, N, and an element A (A is one kind or two or more kinds of element(s) selected from C, Si, Ge, Sn, B, Ga, In, Mg, Ca, Sr, Ba, Sc, Y, La, Gd, Lu, Ti, Zr, Hf, Ta, and W). Inclusion of the element A compensates for electric charge to thereby stabilize the crystal structure including M and O dissolved therein in a solid state, thereby improving the phosphor in luminance. Among them, those inorganic compounds each including Si as the element A are established into phosphors having higher luminance, respectively.

The following ranges are desirable for compositions for allowing obtainment of phosphors including AlN crystals or AlN solid-solution crystals at higher ratios and exhibiting higher luminances, respectively. Namely, the phosphors are each represented by a composition formula $M_aAl_bA_cN_dO_e$ (where a+b+c+d+e=1), and each include elements of M (M is one kind or two or more kinds of element(s) selected from Mn, Ce, Nd, Sm, Eu, Tb, Dy, Ho, Er, Tm, and Yb), A (A is one kind or two or more kinds of element(s) selected from C, Si, Ge, Sn, B, Ga, In, Mg, Ca, Sr, Ba, Sc, Y, La, Gd, Lu, Ti, Zr, Hf, Ta, and W), and elements of Al, O, and N, in which the parameters a, b, c, d, and e are selected from values satisfying all the following conditions:

$$0.00001 \leq a \leq 0.1 \quad (i),$$

$$0.4 \leq b \leq 0.55 \quad (ii),$$

$$0.001 \leq c \leq 0.1 \quad (iii),$$

$$0.4 \leq d \leq 0.55 \quad (iv),$$

and $$0.001 \leq e \leq 0.1 \quad (v)$$

The "a" value represents an adding amount of the element M to be matured into an emission center, and is preferably set between 0.00001 inclusive and 0.1 inclusive in atomic ratio. "a" values less than 0.00001 lead to smaller numbers of M acting as emission centers, thereby deteriorating emission luminances. "a" values larger than 0.1 cause concentration quenching due to interference among M ions, thereby deteriorating luminances. The "b" value represents an amount of an Al element constituting the host crystal, and is preferably set between 0.4 inclusive and 0.55 inclusive in atomic ratio. Deviation of the "b" value from this range leads to unstable bonds in the crystal to increase a generation ratio of crystal phases other than the AlN crystal or AlN solid-solution crystal, thereby deteriorating emission intensity.

The "c" value represents an amount of the A element, and is preferably set between 0.001 inclusive and 0.1 inclusive in atomic ratio. "c" values less than 0.001 lead to poor effects of electric charge compensation to obstruct solid-state dissolution of M and O, thereby deteriorating luminance. "c" values larger than 0.1 increase a generation ratio of crystal phases other than the AlN crystal or AlN solid-solution crystal, thereby deteriorating emission intensity.

The "d" value represents an amount of nitrogen, and is preferably set between 0.4 inclusive and 0.55 inclusive in atomic ratio. Deviation of the "d" value from this range increases a generation ratio of crystal phases other than the AlN crystal or AlN solid-solution crystal, thereby deteriorating emission intensity.

The "e" value represents an amount of oxygen, and is preferably set between 0.001 inclusive and 0.1 inclusive in atomic ratio. "e" values less than 0.001 obstruct solid-state dissolution of M, thereby deteriorating luminance. "e" values larger than 0.1 increase a generation ratio of crystal phases other than the AlN crystal or AlN solid-solution crystal, thereby deteriorating emission intensity.

Embraced as ones of embodiments of the present invention are phosphors where M is Eu and A is Si. Among them, those phosphors serve as blue-aimed ones having peak wavelengths within a range between 450 nm inclusive and 520 nm inclusive, which are each represented by a composition formula $Eu_aAl_bSi_cN_dO_e$ (where a+b+c+d+e=1) and the parameters a, b, c, d, and e satisfy the following conditions:

$$0.00001 \leq a \leq 0.1 \quad (i),$$

$$0.4 \leq b \leq 0.55 \quad (ii),$$

$$0.001 \leq c \leq 0.1 \quad (iii),$$

$$0.4 \leq d \leq 0.55 \quad (iv),$$

and $$0.001 \leq e \leq 0.1 \quad (v)$$

In the above, Eu acts as divalent Eu to contribute to emission.

As ones of embodiments of the present invention, those phosphors where M is Mn are established into red-aimed ones. Among them, those phosphors serve as red-aimed ones having peak wavelengths within a range between 560 nm inclusive and 650 nm inclusive, which are each represented by a composition formula $Mn_aAl_bSi_cN_dO_e$ (where a+b+c+d+e=1) and the parameters a, b, c, d, and e satisfy the following conditions:

$$0.00001 \leq a \leq 0.1 \quad (i),$$

$$0.4 \leq b \leq 0.55 \quad (ii),$$

$$0.001 \leq c \leq 0.1 \quad (iii),$$

$$0.4 \leq d \leq 0.55 \quad (iv),$$

and $$0.001 \leq e \leq 0.1 \quad (v)$$

Those phosphors where M is Mn, each have a long afterglow property. "Long afterglow" means a phenomenon that emission continues even after terminating irradiation of excitation source, and leads to a phosphor suitable as a sign lighting and a mark at night and during power outage. The phosphors of the present invention including Mn each exhibit such a property to have an afterglow time of 5 seconds or longer, where the afterglow time means a period of time over which an emission intensity of 1/10 or stronger is kept even after termination of irradiation of pump light.

In case of utilizing the phosphor of the present invention as a powder, averaged particle sizes between 0.1 μm inclusive and 20 μm inclusive are desirable, from standpoints of dispersibility into resin, flowability of the powder, and the like. Additionally, making the powder as single crystal particles in this range, further improves emission luminance.

The phosphors of the present invention are desirably excited by ultraviolet light or visible light having wavelengths between 100 nm inclusive and 500 nm inclusive, to thereby effectively emit light. The phosphors of the present invention can also be excited by electron beam or X-rays.

The phosphors of the present invention emit fluorescence having peaks at wavelengths within a range of 400 nm to 700 nm, by irradiation of an excitation source thereto. Particularly, emission colors in spectra of sharp shapes having peaks at wavelengths within a range of 420 nm to 550 nm take values of $0 \leqq x \leqq 0.3$ and $0.1 \leqq y \leqq 0.95$ in terms of (x, y) values on CIE chromaticity coordinates, thereby exhibiting blue light or green light with excellent color purity.

In the present invention, although the AlN crystal or AlN solid-solution crystal acting as constituent components are to be highly pure and to be included as much as possible, and are to be possibly and desirably constituted of a single phase from a standpoint of fluorescence emission, it is also possible to constitute the crystal by a mixture with an additional crystal phase or amorphous phase within an extent where due properties are not deteriorated. In this case, it is desirable that the content of AlN crystal or AlN solid-solution crystal is 10 mass % or more, preferably 50 mass % or more, so as to obtain higher luminance. For the range of the main component in the present invention, the content of the AlN crystal or AlN solid-solution crystal is at least 10 mass % or more. The content ratio of the AlN crystal or AlN solid-solution crystal can be obtained from a ratio between strongest peaks of phases of the above crystal and the other crystals, by conducting X-ray diffraction measurement.

In case of phosphors each constituted of mixtures with another crystal phase or amorphous phase, the phosphors may be mixtures with inorganic substances having electroconductivity. In case that the phosphors of the present invention are each excited by electron beam in VFD, PDP, and the like, the phosphors each preferably have a certain electroconductivity so as to release electrons to the exterior without remaining on the phosphors. Examples of electroconductive substances include oxides, oxynitrides, nitrides, and mixtures thereof including one kind or two or more kinds of element(s) selected from Zn, Ga, In, and Sn. Among them, indium oxide and indium-tin oxide (ITO) are desirable by virtue of less deterioration of fluorescence intensity and higher electroconductivity.

Although the phosphors including Eu of the present invention emit blue light or green light, it is possible to mix inorganic phosphors therewith which emit other color(s) such as yellow, red, and the like as required, when the blue color or green color is required to be mixed with such other color(s).

The phosphors of the present invention have different excitation spectra and fluorescence spectra depending on compositions, respectively, and appropriate selections and combinations thereof allow for obtainment of various emission spectra. The configurations may be set at spectra required based on usages, respectively.

Although the phosphors of the present invention are not particularly defined in production method, examples thereof include the following methods.

It is possible to obtain the phosphor of the present invention by firing, in a nitrogen atmosphere at a temperature range between 1,500° C. inclusive and 2,200° C. inclusive, a starting material mixture or metallic compound mixture which is capable of constituting a composition including M, A, Si, Al, O, and N (M is one kind or two or more kinds of element(s) selected from Mn, Ce, Nd, Sm, Eu, Tb, Dy, Ho, Er, Tm, and Yb; and A is one kind or two or more kinds of element(s) selected from C, Si, Ge, Sn, B, Ga, In, Mg, Ca, Sr, Ba, Sc, Y, La, Gd, Lu, Ti, Zr, Hf, Ta, and W) by firing. Although optimum firing temperatures can not be sweptly defined because they differ depending on compositions, it is possible to obtain higher luminance phosphors within a temperature range between 1,820° C. inclusive and 2,000° C. inclusive, in case of $M_a Al_b Si_c N_d O_e$ system (M=Eu, Ce, or Yb). Firing temperatures below 1,500° C. cause the element M acting as an emission center to remain at a grain boundary phase having a higher oxygen content without dissolving, in a solid state, in the AlN crystal or AlN solid-solution crystal, to thereby exhibit emission based on oxide glass as a host, thereby failing to obtain a higher luminance fluorescence. Further, firing temperatures above 2,200° C. are industrially disadvantageous, due to necessity of a specific apparatus.

The patent-unrelated references 1 to 3 are related to synthesis at room temperature where the element M dissolves in an amorphous substance in a solid state. Namely, although the patent-unrelated reference 1 adopts Eu as an activation element identically to the present invention, its emission wavelength corresponds to red color of 600 nm or longer, which is essentially different from emission wavelengths between 450 nm inclusive and 520 nm inclusive by the phosphors of the present invention.

The mixtures of metallic compounds of the present invention are preferably those including M, which are selected from metals, oxides, carbonates, nitrides, and oxynitrides of Al, M, and A. In case that A is Si, mixtures of silicon nitride, aluminum nitride, and oxides of M are preferable. These are rich in reactivity and obtainable as high purity synthetics, and advantageously and readily available since they are produced as industrial materials.

To improve reactivity upon firing, it is possible to add an inorganic compound for generating a liquid phase at the firing temperature or below, into the mixture of metallic compounds as required. Examples of suitable inorganic compounds include those which generate stable liquid phases at reaction temperatures, respectively, such as fluorides, chlorides, iodides, bromides, or phosphates of Li, Na, K, Mg, Ca, Sr, Ba, and Al elements. Without limited to addition of a simple substance, these inorganic compounds may be mixed based on two or more kinds. Among them, calcium fluoride and aluminum fluoride are suitable, because they have higher abilities to improve reactivities for synthesis. Although adding amounts of inorganic compounds are not particularly limited, there is obtained a particularly remarkable effect by amounts between 0.1 parts by weight inclusive and 10 parts by weight inclusive relative to 100 parts by weight of mixture of metallic compounds as a starting material. Amounts less than 0.1 parts by weight lead to less improvement of reactivity, and amounts exceeding 10 parts by weight deteriorate luminances of phosphors. Firing with addition of these inorganic compounds improves reactivities, thereby promoting grain growth in a relatively short time to grow a single crystal having larger particle sizes, to improve luminance of the phosphor.

The nitrogen atmosphere is preferably a gas atmosphere within a pressure range between 0.1 MPa inclusive and 100 MPa inclusive. Pressures between 0.5 MPa inclusive and 10

MPa inclusive are more preferable. In case of adopting silicon nitride as a starting material and heating it to a temperature of 1,820° C. or higher, nitrogen gas atmospheres of 0.1 MPa or lower are disadvantageous due to thermal decomposition of the starting material. Decomposition is rarely caused at 0.5 MPa or higher. 10 MPa is sufficient, and excess of 100 MPa requires a special apparatus and is unsuitable for industrial production.

In case of adopting a fine powder having a particle size of several μm as a starting material, the mixture of metallic compounds after finishing a mixing process exhibits a configuration where the fine powder having the particle size of several μm has aggregated into particles (hereinafter called "powder aggregation") having sizes of several hundreds μm to several mm. In the present invention, the powder aggregations are fired in a state that they are held at a filling ratio exhibiting a bulk density of 40% or less. Here, the relative bulk density indicates a ratio between: a value (bulk density) obtained by dividing a mass of a powder filled in a container, by a volume of the container; and a true density of the powder substance. Namely, although firing is conducted for a powder in a state of higher filling ratio after hot pressing or mold shaping in case of typical production of sialon, the present invention is so configured that powder aggregations of a mixture equalized in granularity are directly filled into a container at a filling ratio exhibiting a bulk density of 40% or less, without applying a mechanical force to the powder and without previously adopting a mold or the like. The powder aggregations can be controlled in granularity as required, by granulating the powder aggregations to have an averaged aggregation size of 500 μm or less by a sieve, air classification, or the like. It is also possible to directly granulate them into shapes of 500 μm or less, by a spray drier or the like. Further, adoption of a container made of boron nitride exhibits an advantage of less reactivity with a phosphor.

The reason, why the starting material powder is to be fired in the state where its bulk density is held at 40% or less, is as follows. Namely, firing the powder in a state where free spaces are left around the powder, causes the crystals of reaction products to grow into the free spaces with less contact among the crystals, thereby enabling synthesis of a crystal having fewer surface defects. This allows for obtainment of a phosphor of higher luminance. Bulk densities exceeding 40% cause partial densification during firing to result in a densely sintered body which obstructs crystal growth, thereby deteriorating luminance of a phosphor. Further, fine powders can not be obtained. Moreover, powder aggregation sizes of 500 μm or less are particularly desirable, by virtue of excellent pulverizability after firing.

Next, powder aggregations having a filling ratio of 40% or less are fired under the above conditions. Since the firing temperature is high and the firing environment is nitrogen, the furnace to be used for firing is preferably an electric one in a metal resistance heating type or black lead resistance heating type which utilizes carbon as a material for the hot portion of the furnace. The firing procedure is preferably a sintering procedure such as an ordinary pressure sintering method or a gas pressure sintering method where no mechanical pressurization is applied from the exterior, so as to conduct firing while keeping the bulk density high.

When the powder aggregations obtained by firing are firmly solidified, the same are to be pulverized by a pulverizer such as a ball mill, jet mill, or the like to be commonly used in factories. Among them, ball mill pulverization is easy in particle size control. Balls and pot to be used then are preferably made of silicon nitride sintered bodies or sialon sintered bodies. Particularly desirable are sintered bodies of a ceramic having the same composition as the phosphor to be established into a product. The pulverization is to be conducted until the averaged particle size becomes 20 μm or less. Particularly desirably, the averaged particle size is between 20 nm inclusive and 5 μm inclusive. Averaged particle sizes exceeding 20 μm lead to a deteriorated flowability of the powder and deteriorated dispersibility thereof in the resin, and lead to non-uniform emission intensities site by site upon fabricating a light emitting apparatus by combination with a light emitting element. Averaged particle sizes of 20 nm or less lead to deteriorated operability of the powder. Classification may be combinedly used, when intended particle sizes are not obtained by pulverization only. Usable as techniques of classification are sieving, air classification, precipitation in liquid, and the like.

Washing the reaction product obtained by firing after firing by a solvent for dissolving inorganic compounds therein, allows for decrease of contents of inorganic compounds other than the phosphor such as a glass phase, second phase, and impurity phase included in the reaction product, thereby improving luminance of the phosphor. Usable as such a solvent are water, and an acidic water solution. Usable as the acidic water solution are sulfuric acid, hydrochloric acid, nitric acid, hydrofluoric acid, and a mixture of organic acid and hydrofluoric acid. Among them, the mixture of sulfuric acid and hydrofluoric acid has a larger effect. This treatment has a particularly remarkable effect for a reaction product obtained by firing at a high temperature by addition of an inorganic compound which generates a liquid phase at the firing temperature or below.

Although the above process allows for obtainment of a fine powder of phosphor, heat treatment is effective for further improvement of luminance. In this case, the powder after firing or the powder after granularity adjustment by pulverization, classification, or the like can be heat treated at a temperature between 1,000° C. inclusive and the firing temperature inclusive. Temperatures below 1,000° C. lead to a less effect of eliminating surface defects. Temperatures above the firing temperature are disadvantageous, due to re-fixation among once pulverized powder particles. Although atmospheres suitable for heat treatment differ depending on compositions of phosphors, it is possible to use a mixed atmosphere of one kind or two or more kinds selected from nitrogen, air, ammonia, and hydrogen, and a nitrogen atmosphere is desirable by virtue of an excellent effect of defect elimination.

The phosphors of the present invention obtained in the above manner are characterized in that they exhibit emission of visible light at higher luminance, as compared with typical oxide phosphors, existing sialon phosphors, and the like. Among them, particular compositions are characterized in that they exhibit emission of blue light or green light having peaks within a range between 420 nm inclusive and 550 nm inclusive, and are suitable for a lighting instrument and an image displaying apparatus. In addition thereto, the phosphors of the present invention are excellent in heat resistance because they are not degraded even by exposure to high temperatures, and are also excellent in long-term stability in an oxidative atmosphere and under a moisture environment.

The lighting instrument of the present invention is constituted of at least a light-emitting source and the phosphor of the present invention. Examples of the lighting instruments include an LED lighting instrument, a fluorescent lamp, and the like. LED lighting instruments can be produced by utilizing the phosphors of the present invention, based on the known methods such as described in JP-A-5-152609, JP-A-7-99345, JP-2927279, and the like. In this case, desirable examples of light-emitting sources include ones for emitting light at wavelengths of 330 to 500 nm, and particularly, ultraviolet (or violet) LED light emitting elements or LD light emitting elements for 330 to 420 nm, or blue LED light emitting elements or LD light emitting elements for 420 to 500 nm.

Such light emitting elements include ones comprising nitride semiconductor such as GaN, InGaN, or the like, which can be made into light-emitting sources for emitting light at predetermined wavelengths by composition adjustment.

In addition to the way to solely adopt the phosphor of the present invention in a lighting instrument, it is possible to constitute a lighting instrument for emitting light in a desired color by combiningly using a phosphor having another emission characteristic. Examples thereof include a combination of: an ultraviolet LED light emitting element or LD light emitting element of 330 to 420 nm; a green-aimed phosphor to be excited at the above-mentioned wavelength to thereby emit light at a wavelength between 520 nm inclusive and 550 nm inclusive; a red-aimed phosphor to be similarly excited to thereby emit light at a wavelength between 600 nm inclusive and 700 nm inclusive; and the blue-aimed phosphor of the present invention. Examples of such green-aimed phosphors include β-sialon:$Eu^{2+}$ described in Japanese Patent Application No. 2004-070894, and examples of such red-aimed phosphors include $CaSiAlN_3$:$Eu^{2+}$ described in Japanese Patent Application No. 2003-394855. In this configuration, ultraviolet rays emitted by the LED or LD are irradiated to the phosphors which then emit light in three colors of red, green, and blue, which are mixed to establish a lighting instrument for emitting white light.

Another way includes a combination of: an ultraviolet LED or LD light emitting element between 330 to 420 nm; a green-aimed phosphor to be excited at the above-mentioned wavelength to thereby have an emission peak at a wavelength between 520 nm inclusive and 550 nm inclusive; a yellow-aimed phosphor to be excited at the above-mentioned wavelength to thereby have an emission peak at a wavelength between 550 nm inclusive and 600 nm inclusive; a red-aimed phosphor to be excited at the above-mentioned wavelength to thereby have an emission peak at a wavelength between 600 nm inclusive and 700 nm inclusive; and the phosphor of the present invention. Examples of such green-aimed phosphors include β-sialon:$Eu^{2+}$ described in Japanese Patent Application No. 2004-070894, examples of such yellow-aimed phosphors include α-sialon:$Eu^{2+}$ described in JP-A-2002-363554, or $(Y, Gd)_2(Al, Ga)_5O_{12}$:Ce described in JP-A-9-218149, and examples of such red-aimed phosphors include $CaSiAlN_3$:$Eu^{2+}$ described in Japanese Patent Application No. 2003-394855. In this configuration, ultraviolet light emitted by the LED or LD is irradiated to the phosphors which then emit light in four colors of blue, green, yellow, and red, which are mixed to establish a lighting instrument for emitting light in white or reddish incandescent color.

The image displaying apparatus of the present invention is constituted of at least an excitation source and the phosphor of the present invention, and examples thereof include a vacuum fluorescent display (VFD), field emission display (FED), plasma display panel (PDP), cathode ray tube (CRT), and the like. It has been confirmed that the phosphors of the present invention can each emit light by excitation of vacuum ultraviolet light from 100 to 190 nm, ultraviolet light from 190 to 380 nm, electron beam, and the like, and combining such an excitation source with the phosphor of the present invention enables establishment of such an image displaying apparatus as described above.

Although the present invention will be detailedly described based on the following Examples, these Examples are disclosed to merely aid in readily understanding the present invention, without limiting the present invention thereto.

EXAMPLE 1

Used as starting material powders were: a silicon nitride powder having an averaged particle size of 0.5 μm, an oxygen content of 0.93 wt %, and an α-type content of 92%; an aluminum nitride powder having a specific surface area of 3.3 $m^2$/g and an oxygen content of 0.79%; and a europium oxide powder having a purity of 99.9%.

To obtain a compound represented by a composition formula $Eu_{0.002845}Al_{0.463253}Si_{0.02845}N_{0.501185}O_{0.004267}$ (Table 1 shows a designed composition, and a mixture composition of starting material powders), there were weighed 6.389 wt %, 91.206 wt %, and 2.405 wt % of a silicon nitride powder, an aluminum nitride powder, and a europium oxide powder; the powders were then mutually mixed for two hours by a wet-type ball mill adopting a pot made of silicon nitride sintered body, balls made of silicon nitride sintered bodies, and n-hexane. The n-hexane was removed by a rotary evaporator, to obtain a dried substance of the mixed powders. The obtained mixture was pulverized by an agate mortar and an agate pestle, followed by passage through a sieve of 500 μm, to obtain powder aggregations excellent in flowability. The powder aggregations were naturally dropped and loaded into a crucible made of boron nitride having dimensions of 20 mm diameter and 20 mm height, thereby exhibiting a bulk density of 30 volume %. The bulk density was calculated from the weight of the loaded powder aggregations, the inner volume of the crucible, and the true density (3.1 g/$cm^3$) of the powder. Next, the crucible was set into an electric furnace of black lead resistance heating type. There was conducted a firing operation by firstly bringing the firing environment to vacuum by a diffusion pump, heating from a room temperature up to 800° C. at a rate of 500° C./hour, introducing nitrogen at a purity of 99.999 vol % at 800° C. to achieve a pressure of 1 MPa, elevating the temperature to 2,000° C. at a rate of 500° C./hour, and holding for 2 hours at 2,000° C.

The synthesized compound was pulverized into a powder by an agate mortar, and there was conducted a powder X-ray diffraction measurement (XRD) by Kα line of Cu. The resultingly obtained chart showed a pattern of FIG. 1.

In FIG. 1, the compound exhibits a 2θ value in measurement by X-ray diffraction adopting a Cu-Kα line such that the 2θ value has diffraction peaks derived from the AlN-based crystal at least in ranges between 32 degrees inclusive and 35 degrees inclusive and between 58 degrees inclusive and 62 degrees inclusive, respectively. Essentially, it is shown that the diffraction peak between 32 degrees inclusive and 35 degrees inclusive is derived from a (100) face of the AlN-based crystal, and the diffraction peak between 58 degrees inclusive and 62 degrees inclusive is derived from a (110) face of the AlN-based crystal, thereby showing that a crystal of wurtzite-type AlN structure was generated.

The powder was measured by a spectrophotofluorometer to provide an emission spectrum and an excitation spectrum, thereby resultingly showing that the powder was a phosphor having a peak at 334 nm in the excitation spectrum, and a peak at blue light of 471 nm in the emission spectrum based on the excitation of 334 nm. The emission intensity at the peak was 1.402 count. Note that the count value has an arbitrary unit, since it varies depending on a measurement device, a measurement condition, and the like. Namely, comparison is allowed only among Examples of the present invention and Comparative Examples measured under the same condition. In the present invention, the count value is indicated by standardization such that the emission intensity of a commercially available YAG:Ce phosphor (P46Y3: produced by KASEI OPTONIX, LTD.) becomes 1 upon excitation at 450 nm.

Figure 2:
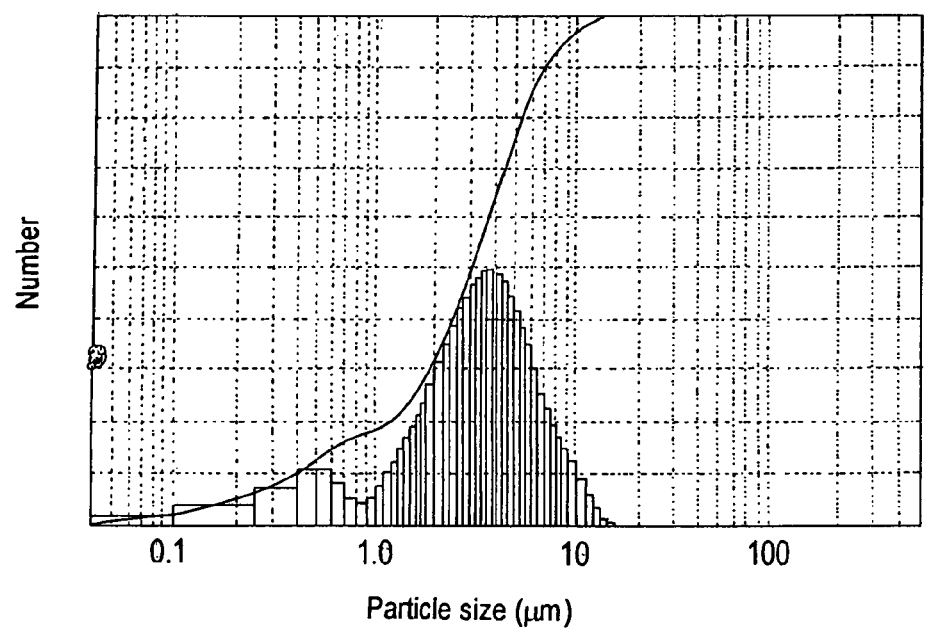
FIG. 2 is a graph of particle size distribution of the inorganic compound of Example 1.

The powder was roughly pulverized, followed by addition of 10 ml of hydrofluoric acid, 10 ml of sulfuric acid, and 380 ml of distilled water within a beaker of Teflon (Registered Trade-Mark), and application of stirring operation for two hours at a room temperature. Filtration drying was conducted after sufficient washing by distilled water. Measurement of a particle size distribution showed that most of particles had particle sizes of 1 μm to 10 μm as shown in FIG. 2, and had an averaged particle size of 3.2 μm.

Figure 3:
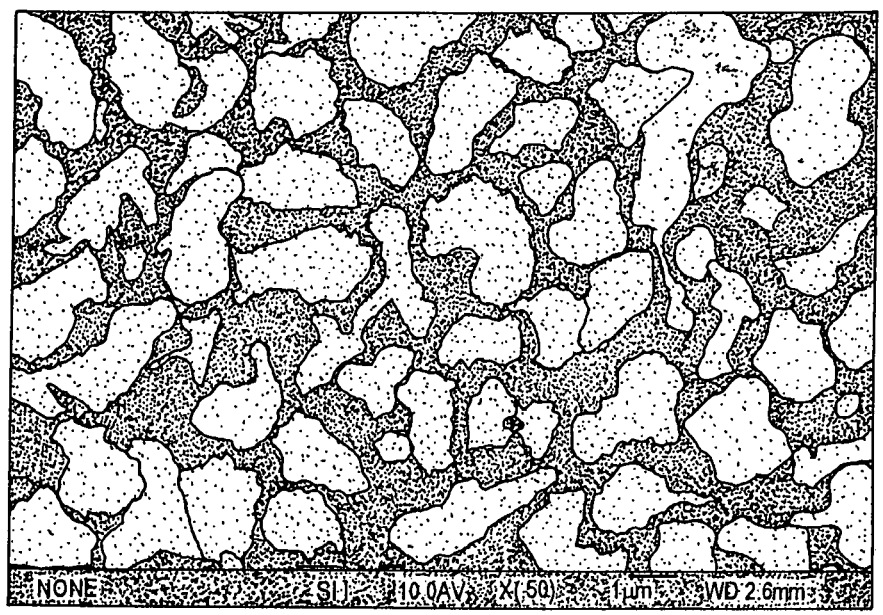
FIG. 3 is an electron micrograph as an observation result of the inorganic compound of Example 1 by a scanning electron microscope (SEM).

The form of the powder was observed by a scanning electron microscope (SEM). As shown in FIG. 3, it was confirmed that the particles were each isolated and had an idiomorphic form in a flattened plate shape.

Figure 4:
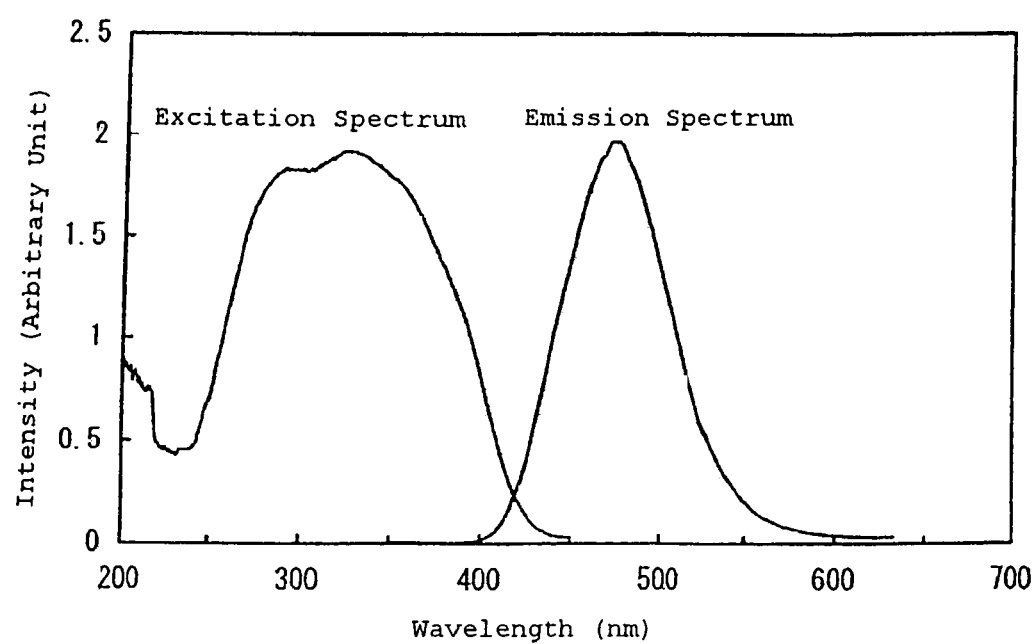
FIG. 4 is a graph of an excitation spectrum and an emission spectrum of Example 1 based on fluorometry.

The powder was irradiated by a lamp emitting light at a wavelength of 365 nm, thereby confirming that the powder emitted blue light. The powder was measured by a spectrophotofluorometer to provide an emission spectrum and an excitation spectrum (FIG. 4), thereby resultingly showing that the powder was a phosphor having a peak at 327 nm in the excitation spectrum, and a peak at blue light of 472 nm in the emission spectrum based on the excitation of 327 nm. The emission intensity at the peak was 1.973 count. Namely, the emission intensity was improved by 1.4 times by acid treatment. The light emitted by excitation at 365 nm was blue having a CIE chromaticity of x=0.18 and y=0.19. There was observed an emission characteristic (cathode luminescence; CL) upon irradiation of electron beam by a SEM having a CL detector, to evaluate a CL image. This device is configured to detect visible light generated by irradiation of electron beam to thereby obtain a photograph image as two-dimensional information, thereby clarifying as to what wavelength of light is emitted at which site. By the emission spectrum observation, it was confirmed that the phosphor exhibited emission of blue light at a wavelength of 470 nm by excitation of electron beam. Further, according to a CL image based on observation of several tens of particles, it was confirmed that no locations were found where particular sites emitted light, and that the insides of the particles uniformly emitted green light. It was further confirmed that no particles were found which emitted light exclusively strongly, and all the several tens of particles uniformly emitted green light.

TABLE 1

Designed composition and mixture composition of Examples.

| | Designed composition | | | | | Mixture composition | | |
|---|---|---|---|---|---|---|---|---|
| | Eu | Al | Si | N | O | (mass %) | | |
| Ex. | a | b | c | d | e | Si$_3$N$_4$ | AlN | Eu$_2$O$_3$ |
| 1 | 0.002845 | 0.463253 | 0.02845 | 0.501185 | 0.004267 | 6.389 | 91.206 | 2.405 |
| 2 | 0.002599 | 0.405803 | 0.077956 | 0.509744 | 0.003898 | 17.578 | 80.217 | 2.205 |
| 3 | 0.002716 | 0.433228 | 0.054323 | 0.505659 | 0.004074 | 12.226 | 85.474 | 2.301 |
| 4 | 0.002914 | 0.479359 | 0.01457 | 0.498786 | 0.004371 | 3.269 | 94.271 | 2.46 |
| 5 | 0.000951 | 0.465525 | 0.028531 | 0.503566 | 0.001427 | 6.481 | 92.706 | 0.813 |
| 6 | 0.001946 | 0.480545 | 0.014591 | 0.5 | 0.002918 | 3.292 | 95.055 | 1.652 |
| 7 | 0.001899 | 0.464387 | 0.02849 | 0.502374 | 0.002849 | 6.435 | 91.951 | 1.614 |
| 8 | 0.001855 | 0.44898 | 0.041744 | 0.504638 | 0.002783 | 9.437 | 88.984 | 1.579 |
| 9 | 0.002879 | 0.471209 | 0.021593 | 0.5 | 0.004319 | 4.847 | 92.721 | 2.432 |
| 10 | 0.002812 | 0.455483 | 0.035145 | 0.502343 | 0.004217 | 7.897 | 89.725 | 2.378 |
| 11 | 0.002779 | 0.447893 | 0.041686 | 0.503474 | 0.004169 | 9.372 | 88.277 | 2.351 |
| 12 | 0.00388 | 0.478177 | 0.014549 | 0.497575 | 0.00582 | 3.245 | 93.498 | 3.257 |
| 13 | 0.003788 | 0.462121 | 0.028409 | 0.5 | 0.005682 | 6.344 | 90.472 | 3.184 |
| 14 | 0.0037 | 0.446809 | 0.041628 | 0.502313 | 0.00555 | 9.308 | 87.579 | 3.114 |
| 15 | 0.005666 | 0.459868 | 0.028329 | 0.497639 | 0.008499 | 6.256 | 89.035 | 4.709 |
| 16 | 0.007533 | 0.457627 | 0.028249 | 0.495292 | 0.011299 | 6.171 | 87.636 | 6.193 |

EXAMPLES 2 TO 16

To obtain each composition shown in Table 1 by adopting the same starting material powders as Example 1, there were weighed predetermined amounts of a silicon nitride powder, an aluminum nitride powder, and a europium oxide powder; the powders were then mutually mixed for two hours by a wet-type ball mill adopting a pot made of silicon nitride sintered body, balls made of silicon nitride sintered bodies, and n-hexane. The n-hexane was removed by a rotary evaporator, to obtain a dried substance of the mixed powders. The obtained mixture was pulverized by an agate mortar and an agate pestle, followed by passage through a sieve of 500 μm, to obtain powder aggregations excellent in flowability. The powder aggregations were naturally dropped and loaded into a crucible made of boron nitride having dimensions of 20 mm diameter and 20 mm height. Next, the crucible was set into an electric furnace of black lead resistance heating type. There was conducted a firing operation by firstly bringing the firing environment to vacuum by a diffusion pump, heating from a room temperature up to 800° C. at a rate of 500° C./hour, introducing nitrogen at a purity of 99.999 vol % at 800° C. to achieve a pressure of 1 MPa, elevating the temperature to 1,900° C. at a rate of 500° C./hour, and holding for 2 hours at that temperature. According to X-ray diffraction, all the obtained fired bodies included 50 mass % or more of AlN or AlN solid solution, thereby obtaining phosphors emitting green light having peaks at wavelengths between 471 nm and 480 nm by excitation of ultraviolet light to visible light as shown in Table 2 based on fluorescence spectral. measurement.

TABLE 2

| Example | Excitation wavelength (nm) | Emission wavelength (nm) | Intensity (arbitrary unit) |
|---|---|---|---|
| 1 | 344 | 471 | 1.402 |
| 2 | 340 | 478 | 0.930 |
| 3 | 335 | 476 | 0.927 |
| 4 | 330 | 471 | 0.595 |
| 5 | 327 | 476 | 0.624 |
| 6 | 332 | 472 | 0.727 |
| 7 | 328 | 476 | 0.929 |
| 8 | 328 | 477 | 0.908 |
| 9 | 327 | 472 | 1.057 |
| 10 | 324 | 478 | 1.097 |
| 11 | 327 | 477 | 1.048 |
| 12 | 330 | 476 | 0.432 |
| 13 | 328 | 475 | 1.196 |
| 14 | 330 | 478 | 1.142 |
| 15 | 334 | 472 | 0.878 |
| 16 | 323 | 477 | 0.803 |

EXAMPLES 17 TO 61

Used as starting materials were the same silicon nitride powder and the same aluminum nitride powder as Example 1, and powders of boron oxide, boron nitride, manganese carbonate, cerium oxide, praseodymium oxide, neodymium oxide, samarium oxide, europium oxide, terbium oxide, and dysprosium oxide. To obtain each composition shown in Table 3, there were weighed predetermined amounts of starting material powders shown in Table 4, and the powders were then mutually mixed for ten minutes by a mortar and a pestle both made of silicon nitride. The obtained mixture was passed through a sieve of 500 μm, to obtain powder aggregations excellent in flowability. The powder aggregations were naturally dropped and loaded into a crucible made of boron nitride having dimensions of 20 mm diameter and 20 mm height. Next, the crucible was set into an electric furnace of black lead resistance heating type. There was conducted a firing operation by firstly bringing the firing environment to vacuum by a diffusion pump, heating from a room temperature up to 800° C. at a rate of 500° C./hour, introducing nitrogen at a purity of 99.999 vol % at 800° C. to achieve a pressure of 1 MPa, elevating the temperature to 1,900° C. at a rate of 500° C./hour, and holding for 2 hours at that temperature.

Figure 7:
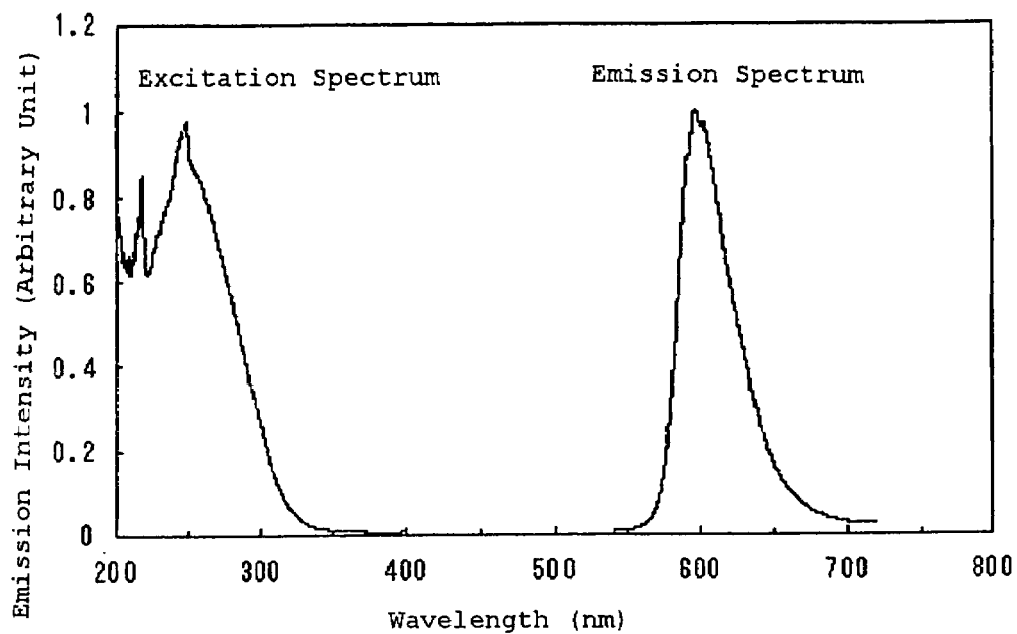
FIG. 7 is a graph of an excitation spectrum and an emission spectrum of an inorganic compound of Example 27 based on fluorometry.
Figure 8:
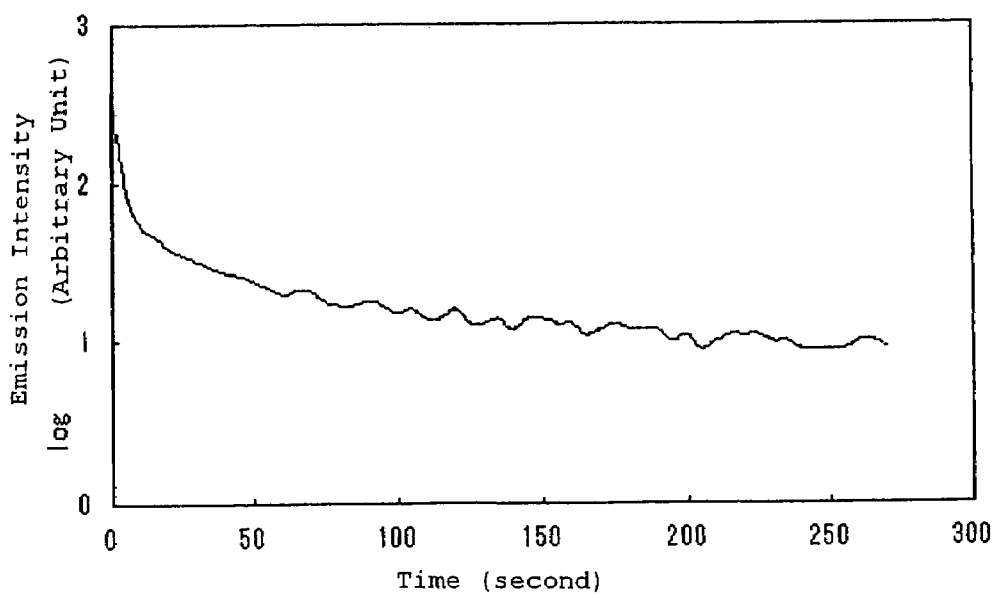
FIG. 8 is a graph of long afterglow property of an inorganic compound of Example 27.

According to X-ray diffraction, all the obtained fired bodies included 50 mass % or more of AlN or AlN solid solution, thereby obtaining phosphors emitting red light having peaks at wavelengths between 560 nm and 650 nm by excitation of ultraviolet light as shown in Table 5 based on fluorescence spectral measurement. FIG. 7 shows an excitation spectrum and an emission spectrum of Example 27. The excitation spectrum has a peak at 247 nm, and excitation at this wavelength leads to emission of red light at 596 nm. FIG. 8 shows a transition of an emission intensity when the phosphor was adopted and ultraviolet pump light having a wavelength of 247 nm was blocked, after subjecting the phosphor to irradiation of the pump light for 30 seconds. The period of time was 30 seconds during which the initial emission intensity was changed to a 1/10 intensity, and a 1/30 emission intensity was kept even after 4 minutes.

TABLE 3

| | Designed Composition | | | | | | | | | | | | |
|---|---|---|---|---|---|---|---|---|---|---|---|---|---|
| Ex. | Si a | Al b | O e | N d | B c | Mn a | Ce a | Pr a | Nd a | Sm a | Eu a | Tb A | Dy a |
| 17 | 0 | 0.0005 | 0.0005 | 0.4995 | 0 | 0.0005 | 0 | 0 | 0 | 0 | 0 | 0 | 0 |
| 18 | 0 | 0.499 | 0.001 | 0.499 | 0 | 0.001 | 0 | 0 | 0 | 0 | 0 | 0 | 0 |
| 19 | 0.0286 | 0.4662 | 0.0005 | 0.5043 | 0 | 0.0005 | 0 | 0 | 0 | 0 | 0 | 0 | 0 |
| 20 | 0.0286 | 0.4657 | 0.001 | 0.5038 | 0 | 0.001 | 0 | 0 | 0 | 0 | 0 | 0 | 0 |
| 21 | 0 | 0.499 | 0.0005 | 0.4995 | 0.0005 | 0.0005 | 0 | 0 | 0 | 0 | 0 | 0 | 0 |
| 22 | 0 | 0.4657 | 0.001 | 0.499 | 0.0005 | 0.001 | 0 | 0 | 0 | 0 | 0 | 0 | 0 |
| 23 | 0.0286 | 0.4652 | 0.0025 | 0.5043 | 0.0005 | 0.0005 | 0 | 0 | 0 | 0 | 0 | 0 | 0 |
| 24 | 0.0286 | 0.4978 | 0.0025 | 0.5038 | 0.0005 | 0.001 | 0 | 0 | 0 | 0 | 0 | 0 | 0 |
| 25 | 0 | 0.4978 | 0.0025 | 0.4978 | 0 | 0.001 | 0.001 | 0 | 0 | 0 | 0 | 0 | 0 |
| 26 | 0 | 0.4978 | 0.0025 | 0.4978 | 0 | 0.001 | 0 | 0.001 | 0 | 0 | 0 | 0 | 0 |
| 27 | 0 | 0.4978 | 0.0025 | 0.4978 | 0 | 0.001 | 0 | 0 | 0.001 | 0 | 0 | 0 | 0 |
| 28 | 0 | 0.4978 | 0.0025 | 0.4978 | 0 | 0.001 | 0 | 0 | 0 | 0.001 | 0 | 0 | 0 |
| 29 | 0 | 0.4978 | 0.0025 | 0.4978 | 0 | 0.001 | 0 | 0 | 0 | 0 | 0.001 | 0 | 0 |
| 30 | 0 | 0.4978 | 0.0025 | 0.4978 | 0 | 0.001 | 0 | 0 | 0 | 0 | 0 | 0.001 | 0 |
| 31 | 0 | 0.4978 | 0.0025 | 0.4978 | 0 | 0.001 | 0 | 0 | 0 | 0 | 0 | 0 | 0.001 |
| 32 | 0 | 0.4978 | 0.0025 | 0.4978 | 0.001 | 0.001 | 0 | 0 | 0 | 0 | 0 | 0 | 0 |
| 33 | 0.0285 | 0.4646 | 0.0024 | 0.5026 | 0 | 0.001 | 0.001 | 0 | 0 | 0 | 0 | 0 | 0 |
| 34 | 0.0285 | 0.4646 | 0.0024 | 0.5026 | 0 | 0.001 | 0 | 0.001 | 0 | 0 | 0 | 0 | 0 |
| 35 | 0.0285 | 0.4646 | 0.0024 | 0.5026 | 0 | 0.001 | 0 | 0 | 0.001 | 0 | 0 | 0 | 0 |
| 36 | 0.0285 | 0.4646 | 0.0024 | 0.5026 | 0 | 0.001 | 0 | 0 | 0 | 0 | 0 | 0 | 0 |
| 37 | 0 | 0.4985 | 0.0015 | 0.4985 | 0 | 0.0015 | 0 | 0 | 0 | 0 | 0 | 0 | 0 |
| 38 | 0 | 0.499 | 0.001 | 0.499 | 0 | 0.001 | 0 | 0 | 0 | 0 | 0 | 0 | 0 |
| 39 | 0 | 0.4966 | 0.004 | 0.4966 | 0 | 0.0003 | 0 | 0 | 0.0025 | 0 | 0 | 0 | 0 |
| 40 | 0 | 0.497 | 0.0035 | 0.497 | 0 | 0.0005 | 0 | 0 | 0.002 | 0 | 0 | 0 | 0 |
| 41 | 0 | 0.4978 | 0.0025 | 0.4978 | 0 | 0.001 | 0 | 0 | 0.001 | 0 | 0 | 0 | 0 |
| 42 | 0 | 0.4981 | 0.002 | 0.4981 | 0 | 0.0013 | 0 | 0 | 0.0005 | 0 | 0 | 0 | 0 |
| 43 | 0 | 0.4984 | 0.0018 | 0.4984 | 0 | 0.001 | 0 | 0 | 0.0005 | 0 | 0 | 0 | 0 |
| 44 | 0 | 0.4965 | 0.004 | 0.4965 | 0 | 0.001 | 0 | 0 | 0.002 | 0 | 0 | 0 | 0 |
| 45 | 0 | 0.494 | 0.007 | 0.494 | 0 | 0.001 | 0 | 0 | 0.004 | 0 | 0 | 0 | 0 |
| 46 | 0 | 0.4985 | 0.0018 | 0.4985 | 0 | 0.0003 | 0 | 0 | 0.001 | 0 | 0 | 0 | 0 |
| 47 | 0 | 0.4973 | 0.003 | 0.4973 | 0 | 0.0015 | 0 | 0 | 0.001 | 0 | 0 | 0 | 0 |
| 48 | 0 | 0.4968 | 0.0035 | 0.4968 | 0 | 0.002 | 0 | 0 | 0.001 | 0 | 0 | 0 | 0 |
| 49 | 0 | 0.4966 | 0.004 | 0.4966 | 0 | 0.0003 | 0 | 0 | 0 | 0 | 0 | 0 | 0.0025 |
| 50 | 0 | 0.497 | 0.0035 | 0.497 | 0 | 0.0005 | 0 | 0 | 0 | 0 | 0 | 0 | 0.002 |

TABLE 3-continued

| | Designed Composition | | | | | | | | | | | | |
|---|---|---|---|---|---|---|---|---|---|---|---|---|---|
| Ex. | Si a | Al b | O e | N d | B c | Mn a | Ce a | Pr a | Nd a | Sm a | Eu a | Tb A | Dy a |
| 51 | 0 | 0.4978 | 0.0025 | 0.4978 | 0 | 0.001 | 0 | 0 | 0 | 0 | 0 | 0 | 0.001 |
| 52 | 0 | 0.4981 | 0.002 | 0.4981 | 0 | 0.0013 | 0 | 0 | 0 | 0 | 0 | 0 | 0.0005 |
| 53 | 0 | 0.4984 | 0.0018 | 0.4984 | 0 | 0.001 | 0 | 0 | 0 | 0 | 0 | 0 | 0.0005 |
| 54 | 0 | 0.4965 | 0.004 | 0.4965 | 0 | 0.001 | 0 | 0 | 0 | 0 | 0 | 0 | 0.002 |
| 55 | 0 | 0.494 | 0.007 | 0.494 | 0 | 0.001 | 0 | 0 | 0 | 0 | 0 | 0 | 0.004 |
| 56 | 0 | 0.4985 | 0.0018 | 0.4985 | 0 | 0.0003 | 0 | 0 | 0 | 0 | 0 | 0 | 0.001 |
| 57 | 0 | 0.4973 | 0.003 | 0.4973 | 0 | 0.0015 | 0 | 0 | 0 | 0 | 0 | 0 | 0.001 |
| 58 | 0 | 0.4968 | 0.0035 | 0.4968 | 0 | 0.002 | 0 | 0 | 0 | 0 | 0 | 0 | 0.001 |
| 59 | 0 | 0.4966 | 0.004 | 0.4966 | 0 | 0.0003 | 0 | 0 | 0 | 0.0025 | 0 | 0 |
| 60 | 0 | 0.497 | 0.0035 | 0.497 | 0 | 0.0005 | 0 | 0 | 0 | 0.002 | 0 | 0 |
| 61 | 0 | 0.4978 | 0.0025 | 0.4978 | 0 | 0.001 | 0 | 0 | 0 | 0.001 | 0 | 0 |

TABLE 4

| Ex. | $Si_3N_4$ | AlN | $B_2O_3$ | BN | $MnCO_3$ | $CeO_2$ | $PrSO_{11}$ | $Nd_2O_3$ | $Sm_2O_3$ | $Eu_2O_3$ | $Tb_4O_7$ | $Dy_2O_3$ |
|---|---|---|---|---|---|---|---|---|---|---|---|---|
| 17 | 0 | 99.72 | 0 | 0 | 0.28 | 0 | 0 | 0 | 0 | 0 | 0 | 0 |
| 18 | 0 | 99.441 | 0 | 0 | 0.56 | 0 | 0 | 0 | 0 | 0 | 0 | 0 |
| 19 | 6.516 | 93.217 | 0 | 0 | 0.27 | 0 | 0 | 0 | 0 | 0 | 0 | 0 |
| 20 | 6.506 | 92.961 | 0 | 0 | 0.53 | 0 | 0 | 0 | 0 | 0 | 0 | 0 |
| 21 | 0 | 99.659 | 0 | 0.06 | 0.28 | 0 | 0 | 0 | 0 | 0 | 0 | 0 |
| 22 | 0 | 99.381 | 0 | 0.06 | 0.56 | 0 | 0 | 0 | 0 | 0 | 0 | 0 |
| 23 | 6.519 | 93.156 | 0 | 0.06 | 0.27 | 0 | 0 | 0 | 0 | 0 | 0 | 0 |
| 24 | 6.508 | 92.901 | 0 | 0.06 | 0.53 | 0 | 0 | 0 | 0 | 0 | 0 | 0 |
| 25 | 0.000 | 98.615 | 0 | 0 | 0.55 | 0.831 | 0 | 0 | 0 | 0 | 0 | 0 |
| 26 | 0.000 | 98.624 | 0 | 0 | 0.55 | 0 | 0.82 | 0 | 0 | 0 | 0 | 0 |
| 27 | 0.000 | 98.633 | 0 | 0 | 0.55 | 0 | 0 | 0.81 | 0 | 0 | 0 | 0 |
| 28 | 0.000 | 98.604 | 0 | 0 | 0.55 | 0 | 0 | 0 | 0.84 | 0 | 0 | 0 |
| 29 | 0.000 | 98.596 | 0 | 0 | 0.55 | 0 | 0 | 0 | 0 | 0.85 | 0 | 0 |
| 30 | 0.000 | 98.544 | 0 | 0 | 0.55 | 0 | 0 | 0 | 0 | 0 | 0.9 | 0 |
| 31 | 0.000 | 98.546 | 0 | 0 | 0.55 | 0 | 0 | 0 | 0 | 0 | 0 | 0.9 |
| 32 | 0.000 | 99.274 | 0.17 | 0 | 0.56 | 0 | 0 | 0 | 0 | 0 | 0 | 0 |
| 33 | 6.461 | 92.218 | 0 | 0 | 0.53 | 0.793 | 0 | 0 | 0 | 0 | 0 | 0 |
| 34 | 6.460 | 92.227 | 0 | 0 | 0.53 | 0 | 0.78 | 0 | 0 | 0 | 0 | 0 |
| 35 | 6.461 | 92.236 | 0 | 0 | 0.53 | 0 | 0 | 0.77 | 0 | 0 | 0 | 0 |
| 36 | 6.459 | 92.202 | 0 | 0 | 0.53 | 0 | 0 | 0 | 0.81 | 0 | 0 | 0 |
| 37 | 0 | 99.163 | 0 | 0 | 0.84 | 0 | 0 | 0 | 0 | 0 | 0 | 0 |
| 38 | 0 | 99.441 | 0 | 0 | 0.56 | 0 | 0 | 0 | 0 | 0 | 0 | 0 |
| 39 | 0 | 97.848 | 0 | 0 | 0.14 | 0 | 0 | 2.01 | 0 | 0 | 0 | 0 |
| 40 | 0 | 98.11 | 0 | 0 | 0.28 | 0 | 0 | 1.62 | 0 | 0 | 0 | 0 |
| 41 | 0 | 98.633 | 0 | 0 | 0.55 | 0 | 0 | 0.81 | 0 | 0 | 0 | 0 |
| 42 | 0 | 98.898 | 0 | 0 | 0.69 | 0 | 0 | 0.41 | 0 | 0 | 0 | 0 |
| 43 | 0 | 99.037 | 0 | 0 | 0.56 | 0 | 0 | 0.41 | 0 | 0 | 0 | 0 |
| 44 | 0 | 97.836 | 0 | 0 | 0.55 | 0 | 0 | 1.61 | 0 | 0 | 0 | 0 |
| 45 | 0 | 96.277 | 0 | 0 | 0.54 | 0 | 0 | 3.18 | 0 | 0 | 0 | 0 |
| 46 | 0 | 99.046 | 0 | 0 | 0.14 | 0 | 0 | 0.81 | 0 | 0 | 0 | 0 |
| 47 | 0 | 98.359 | 0 | 0 | 0.83 | 0 | 0 | 0.81 | 0 | 0 | 0 | 0 |
| 48 | 0 | 98.086 | 0 | 0 | 1.11 | 0 | 0 | 0.81 | 0 | 0 | 0 | 0 |
| 49 | 0 | 97.635 | 0 | 0 | 0.14 | 0 | 0 | 0 | 0 | 0 | 0 | 2.23 |
| 50 | 0 | 97.937 | 0 | 0 | 0.28 | 0 | 0 | 0 | 0 | 0 | 0 | 1.79 |
| 51 | 0 | 98.546 | 0 | 0 | 0.55 | 0 | 0 | 0 | 0 | 0 | 0 | 0.9 |
| 52 | 0 | 98.854 | 0 | 0 | 0.69 | 0 | 0 | 0 | 0 | 0 | 0 | 0.45 |
| 53 | 0 | 98.992 | 0 | 0 | 0.56 | 0 | 0 | 0 | 0 | 0 | 0 | 0.45 |
| 54 | 0 | 97.666 | 0 | 0 | 0.55 | 0 | 0 | 0 | 0 | 0 | 0 | 1.78 |
| 55 | 0 | 95.945 | 0 | 0 | 0.54 | 0 | 0 | 0 | 0 | 0 | 0 | 3.51 |
| 56 | 0 | 98.959 | 0 | 0 | 0.14 | 0 | 0 | 0 | 0 | 0 | 0 | 0.9 |
| 57 | 0 | 98.272 | 0 | 0 | 0.83 | 0 | 0 | 0 | 0 | 0 | 0 | 0.9 |
| 58 | 0 | 97.999 | 0 | 0 | 1.11 | 0 | 0 | 0 | 0 | 0 | 0 | 0.9 |
| 59 | 0 | 97.757 | 0 | 0 | 0.14 | 0 | 0 | 0 | 0 | 2.1 | 0 | 0 |
| 60 | 0 | 98.037 | 0 | 0 | 0.28 | 0 | 0 | 0 | 0 | 1.69 | 0 | 0 |
| 61 | 0 | 98.596 | 0 | 0 | 0.55 | 0 | 0 | 0 | 0 | 0.85 | 0 | 0 |

TABLE 5

| Example | Excitation wavelength (nm) | Emission wavelength (nm) | Intensity (arbitrary unit) |
|---|---|---|---|
| 17 | 248 | 597 | 0.682 |
| 18 | 248 | 597 | 0.758 |
| 19 | 229 | 596 | 0.410 |
| 20 | 228 | 597 | 0.444 |
| 21 | 242 | 597 | 0.494 |
| 22 | 247 | 597 | 0.783 |
| 23 | 230 | 597 | 0.447 |
| 24 | 228 | 597 | 0.439 |
| 25 | 247 | 597 | 0.877 |
| 26 | 247 | 597 | 0.773 |
| 27 | 247 | 596 | 1.014 |
| 28 | 248 | 597 | 0.767 |
| 29 | 247 | 596 | 0.806 |
| 30 | 247 | 597 | 0.634 |
| 31 | 247 | 597 | 0.927 |
| 32 | 247 | 597 | 0.648 |
| 33 | 233 | 597 | 0.388 |
| 34 | 246 | 604 | 0.173 |
| 35 | 220 | 602 | 0.120 |
| 36 | 232 | 598 | 0.421 |
| 37 | 239 | 596 | 0.285 |
| 38 | 240 | 597 | 0.261 |
| 39 | 239 | 596 | 0.576 |
| 40 | 239 | 598 | 0.543 |
| 41 | 243 | 596 | 0.464 |
| 42 | 238 | 596 | 0.544 |
| 43 | 241 | 597 | 0.459 |
| 44 | 239 | 597 | 0.464 |
| 45 | 239 | 596 | 0.604 |
| 46 | 247 | 597 | 0.702 |
| 47 | 247 | 597 | 0.856 |
| 48 | 247 | 597 | 0.749 |
| 49 | 243 | 597 | 0.550 |
| 50 | 244 | 597 | 0.569 |
| 51 | 247 | 597 | 0.601 |
| 52 | 246 | 597 | 0.589 |
| 53 | 244 | 597 | 0.335 |
| 54 | 243 | 597 | 0.356 |
| 55 | 243 | 598 | 0.250 |
| 56 | 242 | 597 | 0.468 |
| 57 | 241 | 597 | 0.482 |
| 58 | 244 | 596 | 0.469 |
| 59 | 239 | 596 | 0.167 |
| 60 | 239 | 597 | 0.193 |
| 61 | 238 | 596 | 0.255 |

Comparative Example will be described, in relation to above-mentioned Examples.

COMPARATIVE EXAMPLE 1

Used as starting material powders were an aluminum nitride powder having a specific surface area of 3.3 m$^2$/g and an oxygen content of 0.79%, and a europium oxide powder having a purity of 99.9%.

The aluminum nitride powder and europium oxide powder were weighed to achieve 97.48 wt % and 2.52 wt %, respectively, to prepare a mixed powder in the same process as Example 1, followed by loading into a boron nitride crucible. Next, the crucible was set into an electric furnace of black lead resistance heating type. There was conducted a firing operation by firstly bringing the firing environment to vacuum by a diffusion pump, heating from a room temperature up to 800° C. at a rate of 500° C./hour, introducing nitrogen at a purity of 99.999 vol % at 800° C. to achieve a pressure of 1 MPa, elevating the temperature to 2,000° C. at a rate of 500° C./hour, and holding for 2 hours at 2,000° C.

The powder was measured by a spectrophotofluorometer to provide an emission spectrum and an excitation spectrum, thereby resultingly showing that the powder had a peak of 550 nm in the emission spectrum based on excitation of 334 nm. The emission intensity at the peak was 0.005 count. Note that the count values can be compared with one another, among the Examples of the present invention and the Comparative Example. In the present invention, the count value is indicated by standardization such that the emission intensity of a commercially available YAG:Ce phosphor (P46Y3: produced by KASEI OPTONIX, LTD.) becomes 1 upon excitation at 450 nm. This Comparative Example includes no Si in its composition, thereby exhibiting a lower emission intensity as compared with those including Si.

Figure 5:
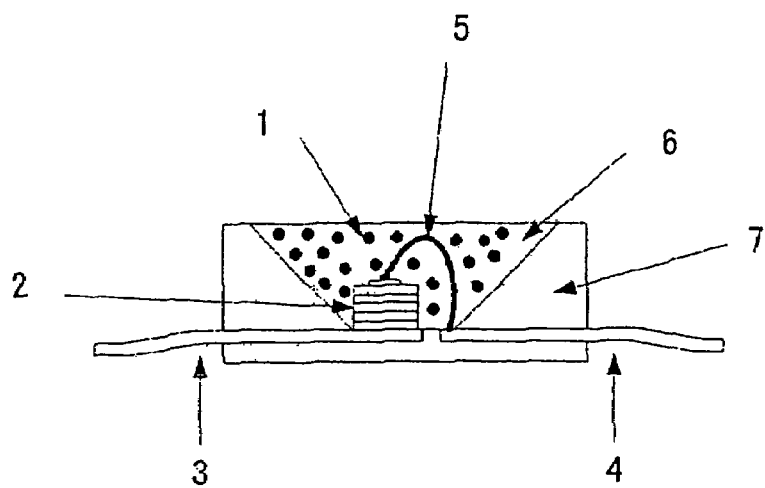
FIG. 5 is a schematic view of a lighting instrument (LED lighting instrument) according to the present invention.

There will be now explained lighting instruments each adopting the phosphor comprising the nitride of the present invention. FIG. 5 is a schematic view of a structure of a white LED as a lighting instrument. The lighting instrument adopts an ultraviolet LED 2 of 380 nm as a light emitting element, and has a structure that the ultraviolet LED 2 is covered by a resin layer including, dispersed therein, the phosphor of Example 1 of the present invention, and a yellow-aimed phosphor of Ca-α-sialon:Eu having a composition of $Ca_{0.75}Eu_{0.25}Si_{8.625}Al_{3.375}O_{1.125}N_{14.875}$. Flowing an electric current through electroconductive terminals of the LED 2 caused it to emit light at 380 nm, which excited the yellow-aimed phosphor and blue-aimed phosphor to cause them to emit yellow light and blue light, respectively, to function as a lighting instrument for emitting white light mixedly including the LED light, yellow light, and blue light. This lighting instrument has a higher color rendering property, since it has a blue color component as compared with adoption of the yellow-aimed phosphor only.

There will be described a lighting apparatus prepared based on another composition different from the above.

Firstly, this had a structure including: an ultraviolet LED of 380 nm as a light emitting element; and a phosphor dispersion resin layer covered on the ultraviolet LED, the resin layer being provided by dispersing, in a layer of resin, the phosphor of Example 1 of the present invention, a green-aimed phosphor (β-sialon:Eu) described in Example 1 of the patent-related reference 3, and a red-aimed phosphor ($CaSiAlN_3$:Eu) described in Example 1 of the patent-related reference 6. Flowing an electric current through electroconductive terminals of the LED caused it to emit light at 380 nm, which excited the blue-aimed phosphor, green-aimed phosphor, and red-aimed phosphor to cause them to emit blue light, green light, and red light, respectively, so that the lighting apparatus functioned as one for emitting white light mixedly including the light from the phosphors.

Figure 6:
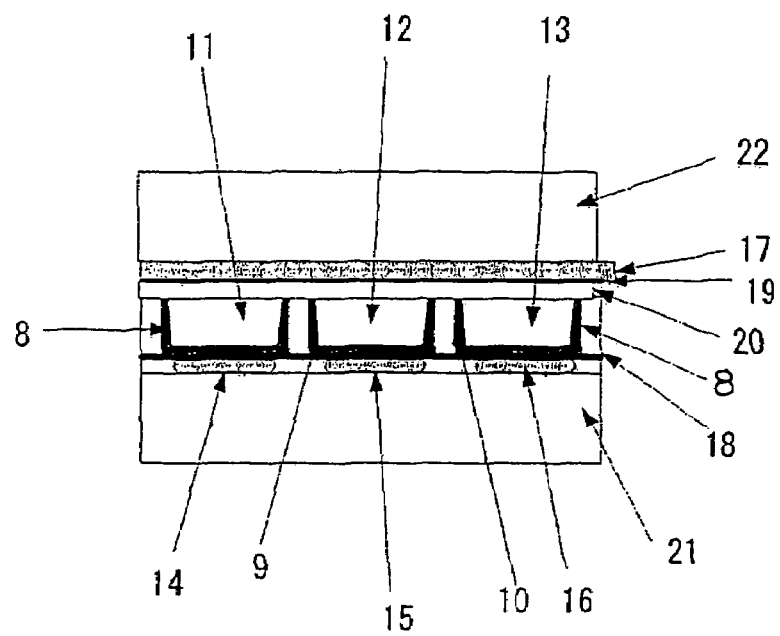
FIG. 6 is a schematic view of an image displaying apparatus (plasma display panel) according to the present invention.

There will be explained an exemplary design of an image displaying apparatus adopting the nitride phosphor of the present invention. FIG. 6 is a principle schematic view of a plasma display panel as an image displaying apparatus. The apparatus includes cells 11, 12, and 13 having inner surfaces coated with a red-aimed phosphor ($Y(PV)O_4$:Eu), a green-aimed phosphor ($Zn_2SiO_4$:Mn), and the blue-aimed phosphor of Example 1 of the present invention, respectively. Flow of electric current through electrodes 14, 15, 16, and 17 generates vacuum ultraviolet light by Xe discharge within the cells, to thereby excite the phosphor s in a manner to emit visible light of red, green, and blue, respectively, so that these light are observed from the exterior through a protection layer 20, a dielectric layer 19, and a glass substrate 22, and thus the panel functions as an image displaying apparatus.

INDUSTRIAL APPLICABILITY

The nitride phosphors of the present invention exhibit emission of blue light or red light different from those of the conventional sialons, and are less in luminance deterioration even upon exposure to excitation sources, thereby serving as nitride phosphors preferably usable for VFD, FED, PDP, CRT, white LED, and the like. Thus, the nitride phosphors of the present invention are expected to be utilized to a great extent in material design of various display devices, thereby contributing to development of the industry.

The invention claimed is:

1. An image displaying apparatus including an excitation source based on electron beam, electric field, vacuum ultraviolet light, or ultraviolet light, and a constituent phosphor, wherein the constituent phosphor includes a compound including: a metallic element M (M is at least one kind of element selected from Mn, Ce, Nd, Sm, Eu, Tb, Dy, Ho, Er, Tm, and Yb); Al; O; N; and an element A (A is at least one kind of element selected from C, Si, Ge, Sn, B, Ga, In, Mg, Ca, Sr, Ba, Sc, Y, La, Gd, Lu, Ti, Zr, Hf, Ta, and W), and wherein the compound is an AlN-based crystal.

2. The image displaying apparatus of claim 1, wherein the image displaying apparatus is a vacuum fluorescent display (VFD), field emission display (FED), plasma display panel (PDP), or cathode ray tube (CRT).

3. The image displaying apparatus of claim 1, wherein the AlN-based crystal has a wurtzite-type AlN crystal structure or a crystal structure selected from 2Hδ, 27R, 21R, 12H, 15R, and 8H.

4. The image displaying apparatus of claim 3, wherein the compound exhibits a 2θ value in measurement by X-ray diffraction adopting a Cu-Kα line such that the 2θ value has diffraction peaks derived from the AlN-based crystal at least in ranges between 32 degrees inclusive and 35 degrees inclusive and between 58 degrees inclusive and 62 degrees inclusive, respectively.

5. The image displaying apparatus of claim 4, wherein that the diffraction peak between 32 degrees inclusive and 35 degrees inclusive is derived from a (100) face of the AlN-based crystal, and the diffraction peak between 58 degrees inclusive and 62 degrees inclusive is derived from a (110) face of the AlN-based crystal.

6. The image displaying apparatus of claim 1, wherein the compound is represented by a composition formula $M_a Al_b A_c N_d O_e$ (where a+b+c+d+e=1) satisfying the following conditions:

$$0.00001 \leq a \leq 0.1 \quad \text{(i)},$$

$$0.4 \leq b \leq 0.55 \quad \text{(ii)},$$

$$0.001 \leq c \leq 0.1 \quad \text{(iii)},$$

$$0.4 \leq d \leq 0.55 \quad \text{(iv), and}$$

$$0.001 \leq e \leq 0.1 \quad \text{(v)}.$$

7. The image displaying apparatus of claim 6, wherein the compound includes at least Si as the element A, and at least Eu as the metallic element M where Eu is divalent; and
   that the compound has an emission peak wavelength within a range between 450 nm inclusive and 520 nm inclusive.

8. The image displaying apparatus of claim 6, wherein the compound includes at least Mn as the metallic element M; and
   that the compound has an emission peak wavelength within a range between 560 nm inclusive and 650 nm inclusive.

9. The image displaying apparatus of claim 1, wherein the constituent phosphor further includes a crystal phase or amorphous phase different from the AlN-based crystal; and
   that the AlN-based crystal is included at a content of 10 mass % or more.

10. The image displaying apparatus of claim 9, wherein the different crystal phase or amorphous phase is an inorganic substance having electroconductivity.

11. The image displaying apparatus of claim 10, wherein the inorganic substance having electroconductivity is oxide, oxynitride, nitride, or a mixture thereof including at least one kind of element selected from Zn, Ga, In, and Sn.

12. The image displaying apparatus of claim 7, wherein the compound is a blue-aimed phosphor, and the excitation source is electron beam.

* * * * *